(12) United States Patent
Horng

(10) Patent No.: US 7,733,653 B1
(45) Date of Patent: Jun. 8, 2010

(54) HEAT RADIATING MEMBER MOUNTING STRUCTURE

(75) Inventor: Chin-Hsing Horng, Taoyuan (TW)

(73) Assignee: Yuan Deng Metals Industrial Co. Ltd, Taoyuan (TW)

( * ) Notice: Subject to any disclaimer, the term of this patent is extended or adjusted under 35 U.S.C. 154(b) by 0 days.

(21) Appl. No.: 12/340,679

(22) Filed: Dec. 20, 2008

(51) Int. Cl.
*H05K 7/20* (2006.01)
(52) U.S. Cl. ............ 361/704; 361/709; 165/80.3; 165/185
(58) Field of Classification Search ........ 361/704, 361/709, 710, 719
See application file for complete search history.

(56) References Cited

U.S. PATENT DOCUMENTS

| | | | | |
|---|---|---|---|---|
| 6,672,379 B1 * | 1/2004 | Wang et al. | ........... | 165/185 |
| 6,772,828 B1 * | 8/2004 | Chen | ........... | 165/78 |
| 6,883,591 B2 * | 4/2005 | Lai | ........... | 165/78 |
| 7,028,755 B2 * | 4/2006 | Fu et al. | ........... | 165/80.3 |
| 7,190,588 B2 * | 3/2007 | Lee et al. | ........... | 361/704 |
| 2005/0051297 A1 * | 3/2005 | Kuo | ........... | 165/80.3 |

* cited by examiner

*Primary Examiner*—Jayprakash N Gandhi
*Assistant Examiner*—Courtney Smith

(57) ABSTRACT

A heat radiating member mounting structure for enabling multiple heat radiating members to be fastened together in a stack without tools is disclosed. Each heat radiating member has convex portions and lugs formed on each of two upright side flanges at two sides of a flat base thereof such that multiple heat radiating members can be fastened together by means of engaging protruding portions of the lugs of one heat radiating member into locating grooves in the convex portions of another heat radiating member.

6 Claims, 6 Drawing Sheets

HEAT RADIATING MEMBER MOUNTING STRUCTURE

BACKGROUND OF THE INVENTION

1. Field of the Invention

The present invention relates to heat dissipation technology and more particularly, to a heat radiating member mounting structure for use to dissipate heat from a heat generating device.

2. Description of the Related Art

An advanced electronic device has a high operation speed. During operation of a high-speed electronic device, much waste heat is produced. To maintain normal functioning of a high-speed electronic device, heat sink or cooler means may be used to carry waste heat away rapidly, avoiding the accumulation of heat. To enhance the heat dissipation performance of a heat sink, the heat spreading surface area must be relatively increased. Increasing the number of heat radiating sheet members or radiation fins can increase the heat spreading surface area. However, increasing the number of heat radiating sheet members or radiation fins of a heat sink relatively lowers the fabrication speed.

Therefore, it is desirable to provide a combination heat sink that can be easily and rapidly assembled, thereby reducing the cost.

SUMMARY OF THE INVENTION

The present invention has been accomplished under the circumstances in view. It is one object of the present invention to provide a heat radiating member mounting structure, which enables multiple identical heat radiating members to be fastened together in a stack rapidly without tools, thereby saving the cost.

To achieve this and other objects of the present invention, a heat radiating member comprises a flat base, and two side flanges respectively perpendicularly extended from two opposite lateral sides of the flat base in a parallel manner. Each side flange comprises a plurality of convex portions, and a plurality of lugs respectively disposed above said convex portions. Each convex portion defines a locating groove at an outer side. Each lug comprises a protruding portion fitting the configuration of the locating groove. By means of engaging the protruding portions of the lugs of one heat radiating member into the locating grooves of another heat radiating member, multiple heat radiating members are fastened together in a stack.

DETAILED DESCRIPTION OF THE PREFERRED EMBODIMENT

Figure 1:
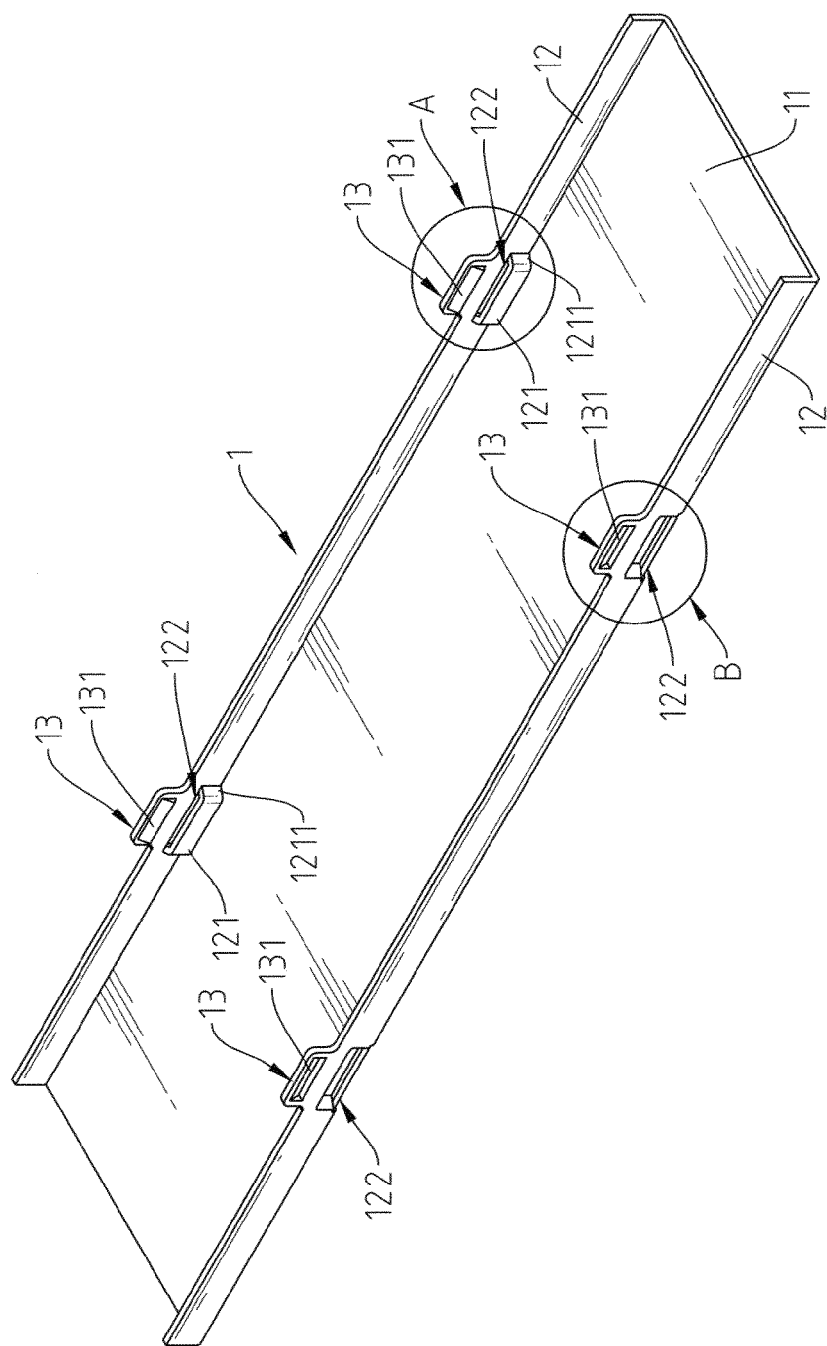
FIG. 1 is an oblique elevation of a heat radiating member constructed according to the present invention.
Figure 2:
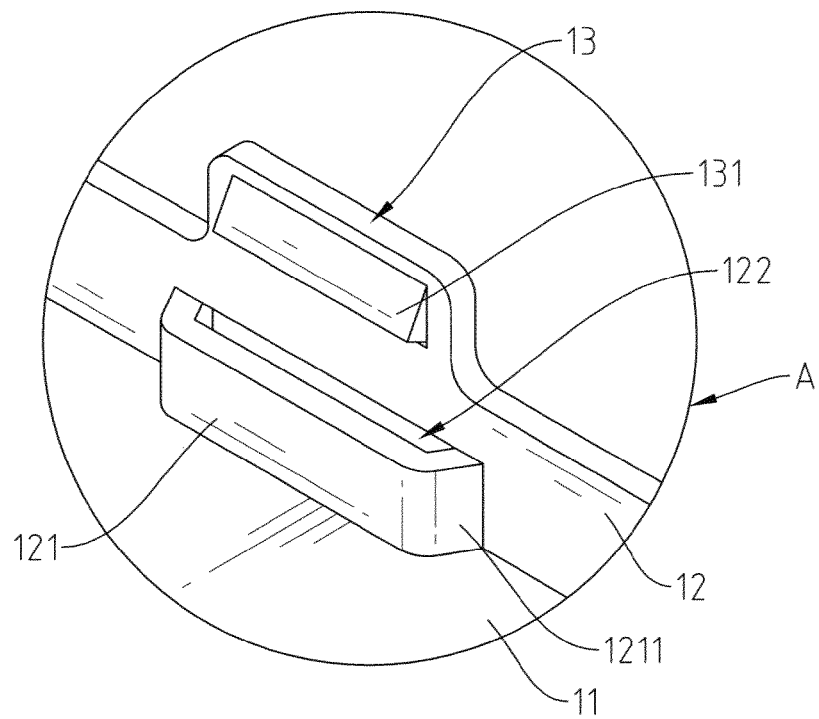
FIG. 2 is an enlarged view of part A of FIG. 1.
Figure 3:
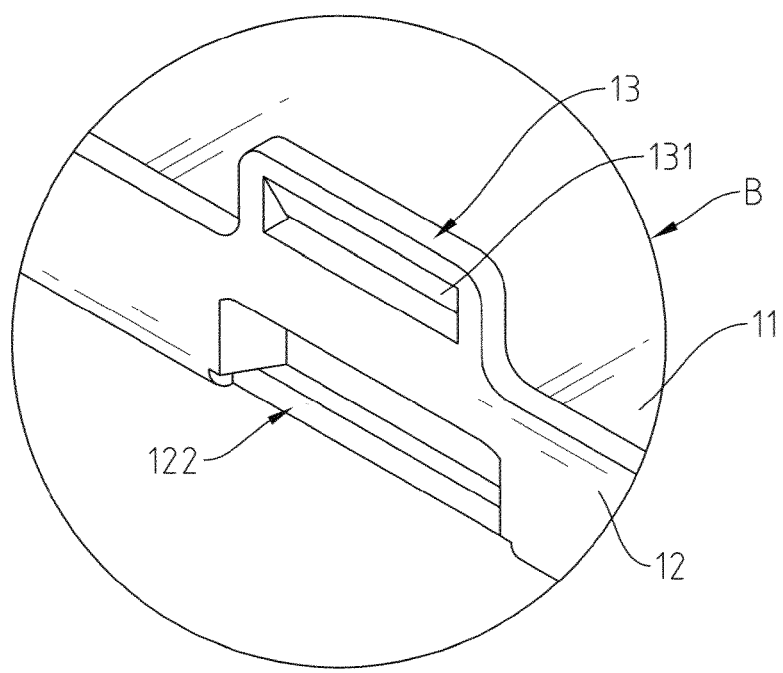
FIG. 3 is an enlarged view of part B of FIG. 1.

Referring to FIGS. 1~3, a heat radiating member 1 is a single-piece member made of a thermally conductive sheet material (such as copper or aluminum sheet material), comprising a flat base 11 for attaching to the surface of a heat generating device (not shown) to dissipate heat energy from the heat generating device, two side flanges 12 respectively perpendicularly extended from two opposite lateral sides of the flat base 11 in a parallel manner. Each side flange 12 comprises a plurality of convex portions 121 arranged in a line, and a plurality of lugs 13 respectively disposed above the convex portions 121. The convex portion 121 has two beveled guide edges 1211 symmetrically disposed at two opposite lateral sides thereof, and a locating groove 122. Further, the convex portion 121 has its bottom side stopped against the flat base 11. The locating groove 122 is formed in an outer side of the convex portion 121, having a depth greater than the wall thickness of the side flanges 12. Further, each lug 13 has a protruding portion 131 fitting the configuration of the locating groove 122.

Figure 4:
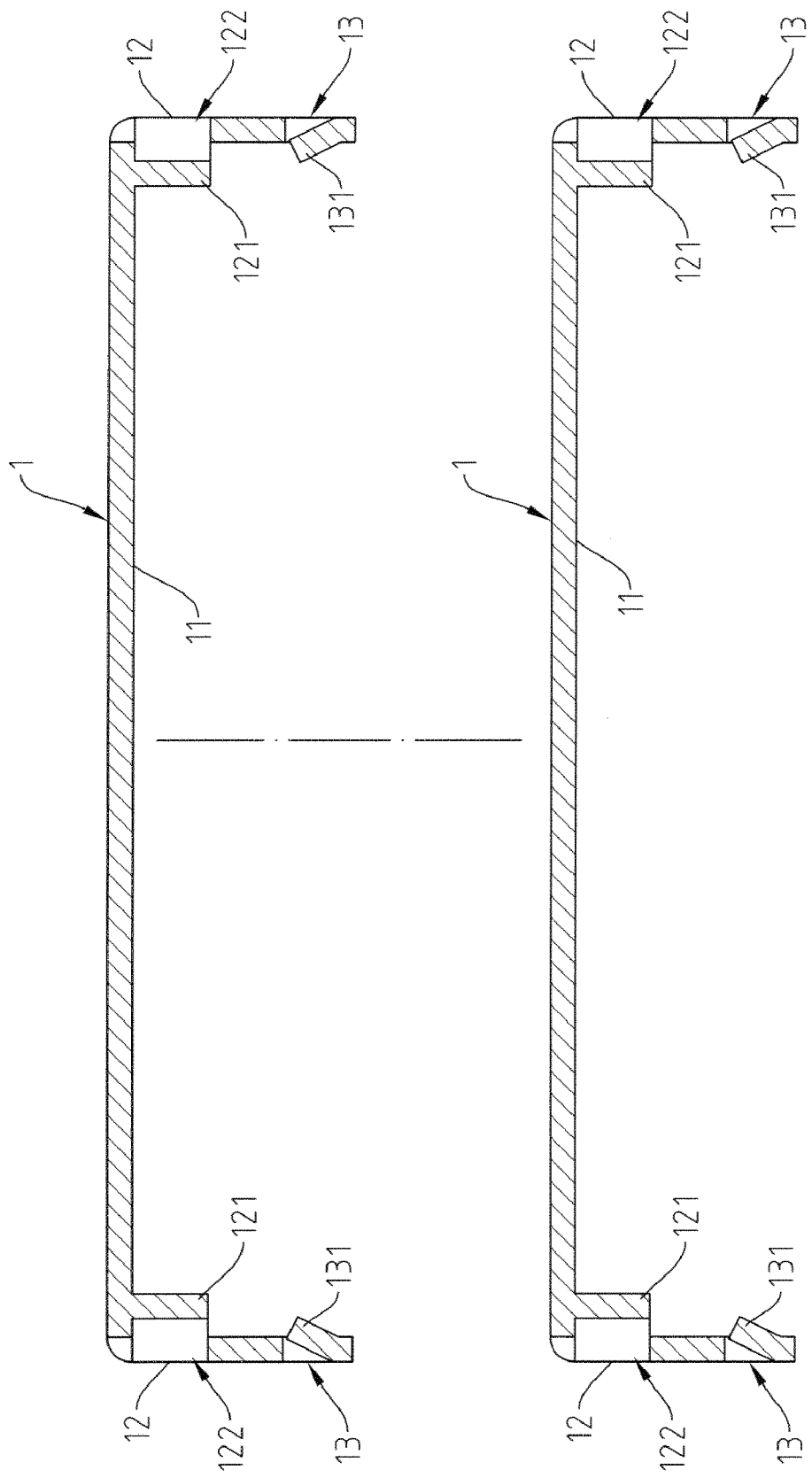
FIG. 4 is a schematic sectional side view of two heat radiating members before installation.
Figure 5:
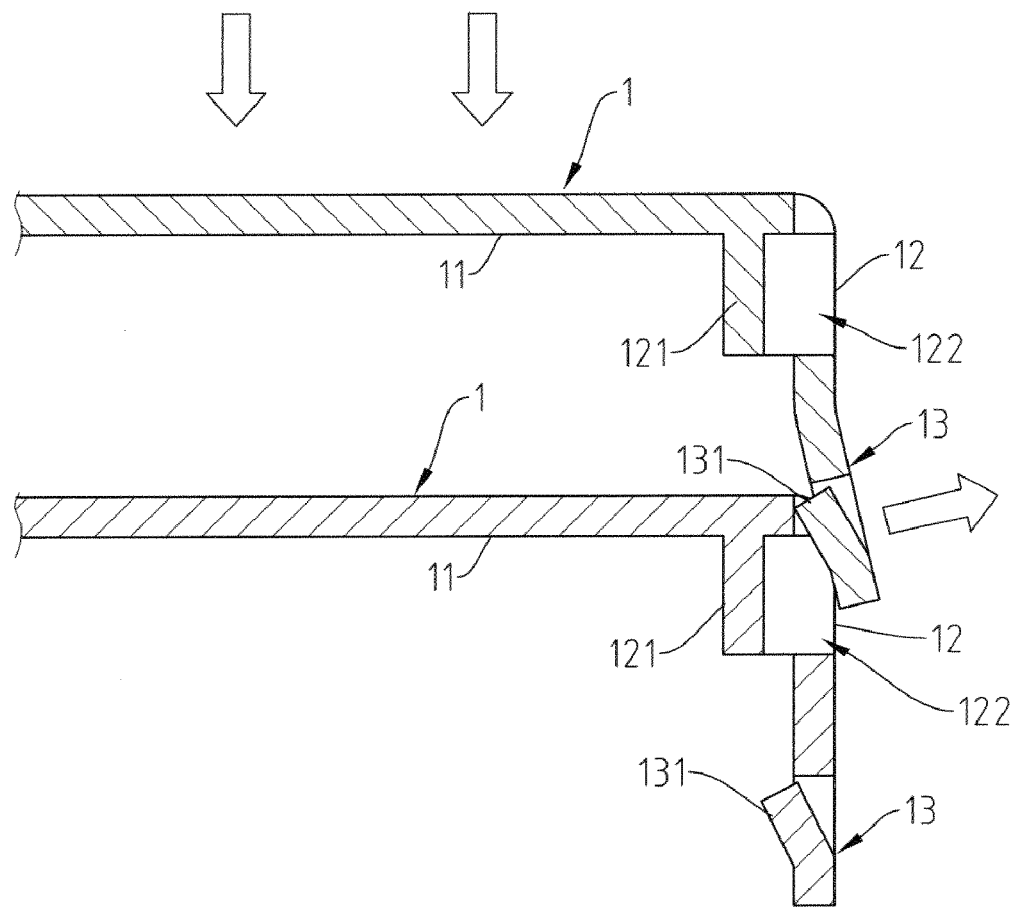
FIG. 5 corresponds to FIG. 4, showing the protruding portions of the lugs of the upper heat radiating member moved over the two opposite lateral edges of the flat base of the lower heat radiating member.
Figure 6:
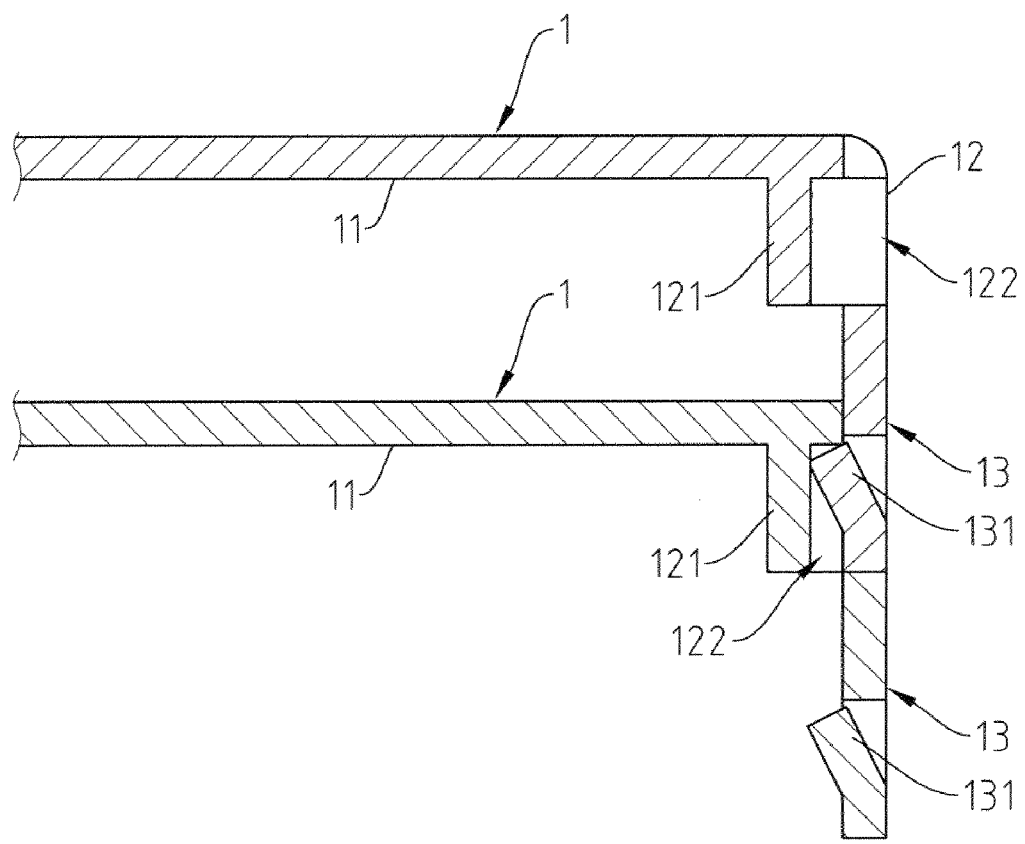
FIG. 6 corresponds to FIG. 5, showing the protruding portions of the upper heat radiating member respectively engaged into the respective locating grooves of the lower heat radiating member.

Referring to FIGS. 4~6, a plurality of heat radiating members 1 can be fastened together in a stack conveniently without any tools. When fastening two heat radiating members 1 together, aim the lugs 13 of the upper heat radiating member 1 at the locating grooves 122 of the lower heat radiating member 1, and then move the upper heat radiating member 1 downwards to move the protruding portions 131 of the lugs 13 of the upper heat radiating member 1 over the two opposite lateral edges of the flat base 11 of the lower heat radiating member 1, forcing the two side flanges 12 of the upper heat radiating member 1 to deform elastically outwardly (because the arm of force of each protruding portion 131 is shorter than the associating side flange 12, a great stress is produced, and the minor elastic deformation of each protruding portion 131 is insignificant). When the protruding portions 131 of the lugs 13 of the upper heat radiating member 1 are completely moved over the flat base 11 of the lower heat radiating member 1, the protruding portions 131 receive no resisting force and immediately return to their former shape to engage the respective locating grooves 122 of the lower heat radiating member 1, and therefore the protruding portions 131 of the upper heat radiating member 1 are respectively stopped at the bottom side of the flat base 11 of the lower heat radiating member 1 to prohibit disconnection of the upper heater radiating member 1 from the lower heat radiating member 1.

Figure 7:
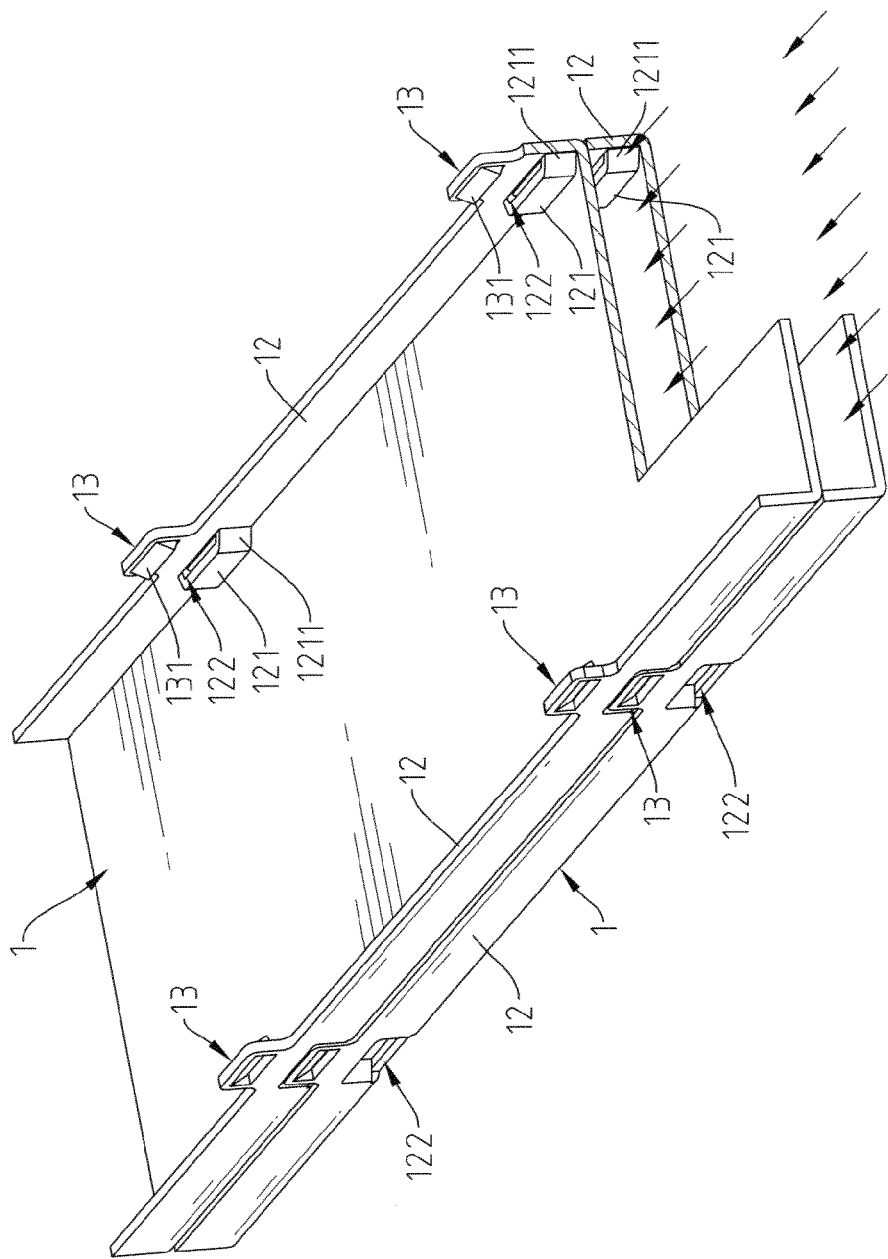
FIG. 7 is a schematic sectional elevation, showing a status of use of the present invention.

Referring to FIG. 7, when multiple heat radiating members 1 are fastened together and attached to a heat generating device (not shown) to dissipate heat from the heat generating device, the flat base 11 of the lowest heat radiating member 1 is kept in close contact with the top surface the heat generating device. The combination of heat radiating members 1 can be used with a cooling fan (not shown), enabling induced currents of air to flow through the gap in between each two adjacent heat radiating members 1 (see the arrowhead signs). When induced currents of air are flowing through the heat radiating members 1, the beveled guide edges 1211 of the convex portion 121 of the side flanges 12 guide the flowing of induced currents of air, avoiding turbulence and heat energy detaining.

In conclusion, the invention has the following advantages of characteristics:

1. The convex portions 121 and protruding portions 131 are directly formed of a part of the heat radiating member 1 by means of a stamping technique, and the formation of the convex portions 121 and protruding portions 131 greatly reinforces the structural strength of the heat radiating member 1 for durable use.

2. Identical heat radiating members 1 can be fastened together in a stack conveniently and rapidly without any tools.

3. The invention utilizes the beveled guide edges 1211 to avoid turbulence and heat energy detaining, enhancing heat dissipation efficiency.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A heat radiating member mounting structure, comprising a plurality of heat radiating members made of a thermally conductive sheet material and fastened together in a stack for dissipating heat, each of said heat radiating members comprising a flat base and two side flanges respectively perpendicularly extending from two opposite lateral sides of said flat base in a parallel manner for mounting, wherein each of said side flanges comprises a plurality of convex portions, and a plurality of lugs respectively disposed above said convex portions, each of said convex portions defining a locating groove, said locating groove having a depth perpendicular to the corresponding side flange that is greater than the wall thickness of that side flange, each of said lugs comprising a protruding portion that protrudes along a direction perpendicular to the corresponding side flange for fitting the configuration of said locating groove so that the protruding portions of the lugs of one said heat radiating member are respectively engageable into the locating grooves of another said heat radiating member to couple the heat radiating members together.

2. The heat radiating member mounting structure as claimed in claim 1, wherein each of said convex portions has a bottom side stopped against the flat base of the respective heat radiating member.

3. The heat radiating member mounting structure as claimed in claim 1, wherein each of said convex portions has two beveled guide edges symmetrically disposed at two opposite lateral sides thereof for guiding air to avoid turbulence.

4. The heat radiating member mounting structure as claimed in claim 1, wherein said thermally conductive sheet material is a copper sheet.

5. The heat radiating member mounting structure as claimed in claim 1, wherein said thermally conductive sheet material is an aluminum sheet.

6. The heat radiating member mounting structure as claimed in claim 1, wherein each of said heat radiating members is a single-piece member.

* * * * *